US010734958B2

(12) United States Patent
Awad et al.

(10) Patent No.: US 10,734,958 B2
(45) Date of Patent: Aug. 4, 2020

(54) LOW-VOLTAGE HIGH-SPEED RECEIVER

(71) Applicant: MediaTek Inc., Hsin-Chu (TW)

(72) Inventors: Ramy Awad, Irvine, CA (US); Tamer Ali, Irvine, CA (US)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 15/433,573

(22) Filed: Feb. 15, 2017

(65) Prior Publication Data

US 2018/0048307 A1    Feb. 15, 2018

Related U.S. Application Data

(60) Provisional application No. 62/372,336, filed on Aug. 9, 2016.

(51) Int. Cl.
*H03G 3/20* (2006.01)
*H04L 25/02* (2006.01)
(Continued)

(52) U.S. Cl.
CPC ............. *H03G 3/20* (2013.01); *H03F 1/0261* (2013.01); *H03F 1/223* (2013.01); *H03F 1/42* (2013.01);
(Continued)

(58) Field of Classification Search
CPC . H03F 1/342; H03F 1/338; H03F 1/38; H03F 2203/5003; H03F 2203/5018;
(Continued)

(56) References Cited

U.S. PATENT DOCUMENTS 3,473,137 A * 10/1969 Stern ........................ H03K 5/02
330/110
3,889,211 A * 6/1975 Morozumi ................ G04F 5/06
327/581
(Continued)

FOREIGN PATENT DOCUMENTS

CN        1206518 A     1/1999
CN      102122924 A     7/2011
(Continued)

OTHER PUBLICATIONS

EP 17183772.7, Oct. 5, 2017, Extended European Search Report.
(Continued)

*Primary Examiner* — Thomas J. Hiltunen
(74) *Attorney, Agent, or Firm* — Wolf, Greenfield & Sacks, P.C.

(57) ABSTRACT

A line receiver is described. The line receiver may be configured to receive signals transmitted via a communication channel, such as a metal trace on a printed circuit board or a cable. The receiver may comprise a buffer and circuitry for enhancing the trans-conductance gain of the buffer. By enhancing the trans-conductance gain of the buffer, linearity may be improved and susceptibility to process and temperature variations may be limited. Enhancement of the trans-conductance gain may be performed using feedback circuitry coupled to the buffer. The receiver may further comprise mirror circuitry configured to provide a desired current to the load. The receiver may further comprise a gain stage for setting the gain of the receiver to a desired level.

19 Claims, 5 Drawing Sheets

(51) Int. Cl.
*H03F 3/45* (2006.01)
*H03F 3/50* (2006.01)
*H03F 1/02* (2006.01)
*H03F 1/22* (2006.01)
*H03F 1/42* (2006.01)

(52) U.S. Cl.
CPC ..... *H03F 3/45179* (2013.01); *H03F 3/45632* (2013.01); *H03F 3/505* (2013.01); *H04L 25/026* (2013.01); *H04L 25/0272* (2013.01); *H04L 25/0292* (2013.01); *H03F 2200/453* (2013.01); *H03F 2203/5012* (2013.01)

(58) Field of Classification Search
CPC ..... H03F 2203/5021; H03F 2203/5024; H03F 2203/5027; H03F 2203/5031; H03F 2203/5033; H03F 2203/5039; H03F 2203/5042; H03F 2203/5045; H03F 3/505
See application file for complete search history.

(56) References Cited

U.S. PATENT DOCUMENTS

| | | | | |
|---|---|---|---|---|
| 4,642,552 | A * | 2/1987 | Suzuki | G05F 3/245 323/312 |
| 5,155,449 | A * | 10/1992 | Ito | H03F 3/505 330/277 |
| 5,465,070 | A * | 11/1995 | Koyama | G06G 7/24 327/350 |
| 5,565,815 | A * | 10/1996 | Klein | G01D 5/16 330/253 |
| 5,668,468 | A * | 9/1997 | Cargill | G05F 3/242 323/316 |
| 5,917,379 | A * | 6/1999 | Ashby | H03F 3/4508 330/260 |
| 6,104,236 | A * | 8/2000 | Tsinker | H04B 3/145 327/336 |
| 6,111,463 | A * | 8/2000 | Kimura | H03F 1/3211 327/359 |
| 6,150,885 | A * | 11/2000 | Ashby | H03F 3/45304 330/257 |
| 6,445,248 | B1 * | 9/2002 | Gilbert | H03F 3/72 330/254 |
| 7,366,048 | B2 * | 4/2008 | Byeon | G11C 5/147 365/189.09 |
| 7,417,415 | B2 * | 8/2008 | Yen | G05F 3/262 323/315 |
| 7,504,292 | B2 * | 3/2009 | Ku | H01L 21/26513 438/197 |
| 7,551,029 | B2 * | 6/2009 | Pan | H03F 1/0205 330/254 |
| 7,804,356 | B2 * | 9/2010 | Gomez | H03G 5/28 330/140 |
| 8,350,738 | B2 * | 1/2013 | Sanduleanu | G11C 27/02 327/96 |
| 8,493,149 | B2 * | 7/2013 | Parikh | H03G 1/0029 330/254 |
| 8,648,660 | B2 * | 2/2014 | Fiocchi | G05F 3/262 330/257 |
| 8,836,374 | B2 * | 9/2014 | Hadji-Abdolhamid | H03K 19/00 327/54 |
| 9,106,465 | B2 * | 8/2015 | Walter | H04L 25/03885 |
| 9,276,468 | B2 * | 3/2016 | Boles | G05F 3/262 |
| 9,379,694 | B2 * | 6/2016 | den Besten | H03K 17/005 |
| 9,826,291 | B2 * | 11/2017 | Shringarpure | H04Q 11/0005 |
| 9,847,758 | B2 * | 12/2017 | Bokui | H03F 1/0205 |
| 10,116,470 | B2 * | 10/2018 | Gu | H03F 3/193 |
| 2002/0140508 | A1 | 10/2002 | Takeuchi et al. | |
| 2002/0175761 | A1 * | 11/2002 | Bach | H03F 3/45206 330/277 |
| 2007/0018725 | A1 * | 1/2007 | Morikawa | H03F 3/45197 330/253 |
| 2009/0289715 | A1 * | 11/2009 | Sengupta | H03F 1/3211 330/261 |
| 2009/0322428 | A1 * | 12/2009 | Zheng | H03F 3/45098 330/253 |
| 2013/0135040 | A1 * | 5/2013 | Shrivastava | H03F 1/32 327/563 |
| 2015/0015326 | A1 * | 1/2015 | Jaffari | G05F 3/205 327/537 |
| 2015/0295538 | A1 * | 10/2015 | Lin | H03F 3/211 330/295 |
| 2015/0341025 | A1 * | 11/2015 | Kong | H03K 17/16 327/382 |
| 2017/0141746 | A1 * | 5/2017 | Soe | H03G 5/28 |
| 2019/0158038 | A1 * | 5/2019 | Beppu | H03F 1/301 |

FOREIGN PATENT DOCUMENTS

| | | |
|---|---|---|
| CN | 105391461 A | 3/2016 |
| EP | 1 417 752 A2 | 5/2004 |
| WO | WO 2002/097975 A2 | 12/2002 |

OTHER PUBLICATIONS

Extended European Search Report for Application No. EP 17183772.7 dated Oct. 5, 2017.
Zare-Hoseini et al., Highly linear transconductance topology using floating transistors. Electronics Letters. Jan. 5, 2006;42(1). 2 pages.
Gopalakrishnan et al., 3.4 A 40/50/100Gb/s PAM-4 Ethernet Transceiver in 28nm CMOS, IEEE International Solid State Circuits Conference, 2016, Session 3, pp. 62-64.

* cited by examiner

LOW-VOLTAGE HIGH-SPEED RECEIVER

RELATED APPLICATIONS

This Application claims priority under 35 U.S.C. § 119(e) to U.S. Provisional Application Ser. No. 62/372,336, entitled "LOW-VOLTAGE HIGH-SPEED RECEIVER" filed on Aug. 9, 2016, which is herein incorporated by reference in its entirety.

BACKGROUND

Line receivers are used in electronics to receive signals transmitted through transmission lines. Types of line receivers include voltage mode drivers and current mode drivers.

BRIEF SUMMARY

According to one aspect of the present application, a line receiver is provided. The line receiver may comprise a buffer configured to receive an input signal, the buffer having a first transconductance gain, feedback circuitry coupled to the buffer and configured to provide a second transconductance gain greater than the first transconductance gain, mirror circuitry coupled to the buffer and configured to generate a current in response to receiving an intermediate signal from the buffer, and a gain stage configured to receive the current and to generate an output signal.

In some embodiments, the current is a first current that is substantially equal to a second current in the buffer.

In some embodiments, the buffer comprises a transistor arranged in a source-follower configuration.

In some embodiments, the transistor is a first transistor and wherein the feedback circuitry further comprises a second transistor coupled to the first transistor and arranged in a common-source configuration.

In some embodiments, the feedback circuitry further comprises an impedance element coupled between a gate terminal of the second transistor and a drain terminal of the first transistor.

In some embodiments, the intermediate signal comprises a voltage of a gate terminal of the second transistor.

In some embodiments, a source terminal of the first transistor is coupled to a drain terminal of the second transistor.

In some embodiments, the line receiver further comprises an impedance element coupled to the source terminal of the first transistor.

In some embodiments, the buffer further comprises a third transistor having a drain terminal coupled to a drain terminal of the first transistor.

In some embodiments, the gain stage comprises a plurality of transistors configured to provide an adjustable gain.

In some embodiments, the minor circuitry comprises a transistor arranged in a common source configuration.

In some embodiments, the gain stage comprises a load coupled to a drain terminal of the transistor.

In some embodiments, the buffer is not configured to withstand supply voltages greater than 1V.

In some embodiments, the buffer comprises a first transistor arranged in a source-follower configuration, the feedback circuitry comprises a second transistor coupled to the first transistor and arranged in a common-source configuration and the mirror circuitry comprises a third transistor arranged in a common-source configuration, wherein the second transistor and the third transistor are configured to receive a common gate/source voltage.

According to another aspect of the present application, a method is provided. The method may comprise receiving an input signal with a buffer having a transconductance gain, amplifying the transconductance gain of the buffer with feedback circuitry coupled to the buffer, generating a current in response to receiving, with minor circuitry, an intermediate signal from the buffer, and generating, with a gain stage, an output signal in response to receiving the current.

In some embodiments, the current is a first current, and wherein generating the first current comprises minoring a second current in the buffer.

In some embodiments, amplifying the transconductance stage with the feedback circuitry comprises biasing a plurality of transistor with an impedance element.

In some embodiments, generating the output signal comprises providing an adjustable gain by selecting at least one among a plurality of drive transistors.

In some embodiments, the method further comprises setting a frequency response by setting a value for an impedance element coupled to the buffer.

In some embodiments, the method further comprises supplying the buffer with a supply voltage that is less than 1V.

The foregoing summary is provided by way of illustration and is not intended to be limiting.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing.

DETAILED DESCRIPTION

The inventors have recognized a challenge in the design of line receivers that has risen as the size of integrated transistors decreases (e.g., as the complementary metal-oxide-semiconductor (CMOS) fabrication node decreases). Smaller transistors are less able to handle the voltage stresses, thus limiting the maximum voltage with which a circuit including such transistors can be supplied. As a result of this reduction in the supply voltage, the linearity of the line receivers is degraded. One of the reasons for such degraded linearity is the difficulty of biasing transistors in the linear region (e.g., a field effect transistor's saturation region or a bipolar transistor's active region) with a low supply voltage (e.g., less than 1V).

To overcome this limitation, some conventional line receivers utilize multiple signal buffers connected in series. The buffers, which provide a high input impedance and a low output impedance, are configured to operate at low supply voltages. However, the use of multiple buffers poses serious limitations on linearity, as well as on power consumption and sensitivity to process and temperature variations. Furthermore, some conventional types of buffers, such as current mode logic (CML) drivers, do not provide means for independently controlling the gain from the frequency response. As a result, increasing the line receiver's gain will cause a decrease in the bandwidth of the line receiver, or vice versa. Therefore, designers of line receivers may have to make design compromises.

Other conventional line receivers deal with the inability of small transistors to tolerate large supply voltage by separating a die into two portions: one portion includes an analog circuit configured to receive a high supply voltage (e.g., equal to or greater than 1V), and the other portion includes a digital circuit configured to receive a low supply voltage (e.g., lower than 1V). Due to the larger supply voltage received, the analog circuit provides the desired level of linearity. On the other hand, due to the lower supply voltage, the digital circuit can process digital signals without incurring stress. While this solutions provides the desired linearity, supplying a receiver with multiple voltages may be undesirable due to the added complexity.

The inventors have developed line receivers, also referred to herein simply as receivers, that can provide the linearity desired while overcoming at least some of the drawbacks of prior solutions. In particular, the inventors have appreciated that linearity can be increased by increasing the trans-conductance gain of the buffer used to receive input signals. In some embodiments, the trans-conductance gain may be increased by providing a feedback circuit coupled to the buffer. In this way, the resulting trans-conductance gain may be proportional to the product of the trans-conductance gain of the buffer and the trans-conductance gain of the feedback circuit. In some embodiments, to further increase the trans-conductance gain, the feedback circuit may be coupled to a node having a high impedance.

The inventors have further appreciated that by increasing the trans-conductance gain of the buffer, the line receiver's sensitivity to temperature and process variations may be mitigated. In fact, in some embodiments, a larger trans-conductance gain may result in the line receiver having a gain that depends mainly on passive components (e.g., resistors). Compared to active components (e.g., transistors), the characteristics of passive components are less prone to fluctuations caused by temperature and process variations. As a result, gains that mainly depend on passive components may also experience less fluctuations. In some embodiments, in order to provide a gain that depends mainly on passive components, a mirror circuit may be used. The mirror circuit may be coupled to the feedback circuit and may have a trans-conductance gain that substantially matches (e.g., is within 75% and 125%, within 90% and 110%, within 95% and 105%, or within 99% and 101%) the trans-conductance gain of the feedback circuit. In this way, the current flowing in the load, and a result the gain of the line receiver, may be substantially independent from active components.

Figure 1:
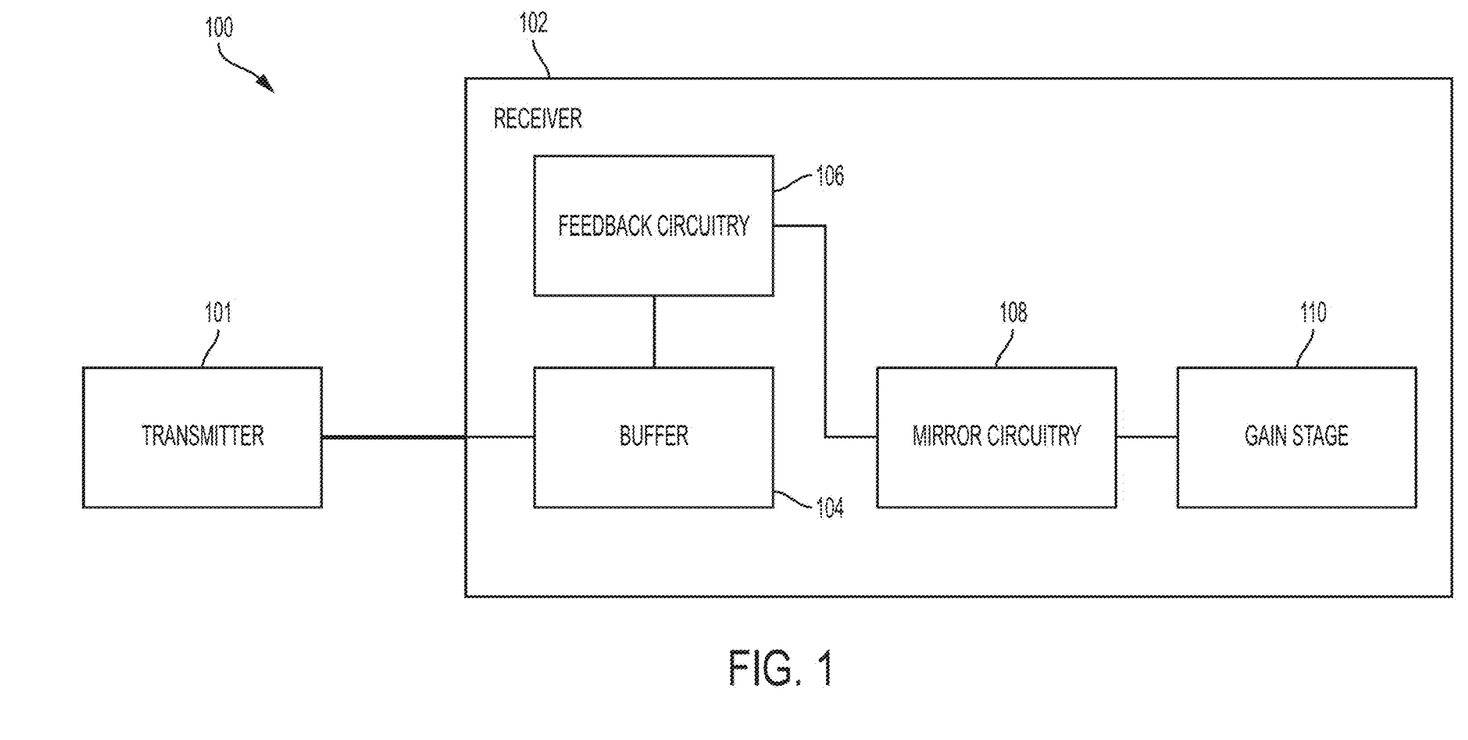
FIG. 1 is a block diagram illustrating a communication system, according to some non-limiting embodiments.

FIG. 1 is a block diagram illustrating an example of a communication system, according to some non-limiting embodiments. Communication system 100 may comprise a transmitter 101 and a receiver 102. The transmitter 101 may be electrically coupled to the receiver 102 via a communication channel, such as cable (e.g., a twinax or a coax) and/or a metal trace on a printed circuit board. Alternative types of communications channels may be used. Transmitter 101 may be configured to transmit data at more than 10 Gb/s, more than 20 Gb/s, more than 30 Gb/s, more than 40 Gb/s, more than 50 Gb/s, or more than any other suitable value. In some embodiments, transmitter 101 may operate between 40 Gb/s and 80 Gb/s, or within any range within such range.

Receiver 102 may be configured to receive signals transmitted by transmitter 101 through the communication channel. In some embodiments, receiver 102 may include buffer 104, feedback circuitry 106, mirror circuitry 108 and gain stage 110. Buffer 104 may be configured to receive the signal provided by transmitter 101. In some embodiments, buffer 104 has a large input impedance (e.g., more than 100KΩ, more than 500 KΩ, or more than 1MΩ), and a small output impedance (e.g., less than 1KΩ, less than 100Ω, or less than 10Ω). In this way, buffer 104 may operate as an impedance transformer, thus preventing the load from loading the buffer excessively. In some embodiments, buffer 104 may be implemented using a source follower.

Feedback circuit 106 may be coupled to buffer 104 in any suitable way. In some embodiments, feedback circuitry 106 may be coupled between the output terminal of buffer 104 and a node of buffer 104 having a large impedance (e.g., more than 5KΩ, more than 50 KΩ, or more than 100KΩ). In other embodiments, feedback circuitry 106 may be coupled between the input and output terminals of buffer 104. Feedback circuitry 106 may be configured to increase the trans-conductance gain of buffer 104 by any suitable amount. For example, the trans-conductance gain may be increased by a factor between 1 and 1000, between 1 and 100, between 1 and 10, between 10 and 100, between 100 and 1000, or between any values between such ranges. In some embodiments, the multiplication factor may be proportional to the trans-conductance gain of feedback circuitry 106. Feedback circuitry 106 may be configured to bias buffer 104. For example, feedback circuitry 106 may be configured to bias buffer 104 in a linear region (e.g., in a saturation region if buffer 104 is implemented using field effect transistors or in an active region if buffer 104 is implemented using bipolar transistors).

Mirror circuitry 108 may be coupled to buffer 104 and/or feedback circuitry 106 in any suitable way. In some embodiments, mirror circuitry 108 may share one or more terminals with feedback circuitry 106. In some embodiments, the mirror circuit may have a trans-conductance gain that substantially matches (e.g., is within 75% and 125%, within 90% and 110%, within 95% and 105%, or within 99% and 101%) the trans-conductance gain of the feedback circuitry. The mirror circuitry may be used to generate a current substantially matching a current flowing in an impedance element of buffer 104. As will be described further below, in this way the current provided by mirror circuitry 108 may mainly depend on passive components (e.g., resistive elements).

Gain stage 110 may comprise a load. The load may comprise a resistive element in some embodiments. The resistive element may be implemented in any suitable way, including a resistor and/or an active load. Resistors may be implemented using a doped region of semiconductor material having a size designed to provide a desired resistance. The load may receive the current generated by mirror circuitry 108. In some embodiments, gain stage 110 may comprise circuitry for adjusting the amount of current flowing in the load. In some such embodiments, gain stage 110 may comprise a plurality of drivers connected in parallel. The drivers may be turned on/off to provide a desired output current, and thus a desired gain.

The receiver illustrated in FIG. 1 may be implemented using transistors in some embodiments. The transistors may be fabricated on a monolithic substrate using semiconductor fabrication techniques. In some embodiments, the transistors may comprise field effect transistors, such as metal oxide semiconductor field effect transistors (MOSFET), or junction field effect transistors (JFET). In other embodiments, the transistors may comprise bipolar transistors, such as bipolar junction transistors (BJT). In yet other embodiments, hybrid configuration may be used. In some embodiments, the transistors may be fabricated using a fabrication node that is less than 14 nm, less than 12 nm, less than 10 nm, less than 8 nm, or less than 6 nm. Due to their size, the resulting transistors may be configured to receive supply voltages that are less than a certain threshold (e.g., less than or equal to 1.2V, less than or equal to 1.1V, less than or equal to 1V, less than or equal to 0.9V, less than or equal to 0.8V, less than or equal to 0.7V, less than or equal to 0.6V, less than or equal to 0.5V, or less than any suitable value). If the transistors receive supply voltages that are larger than the threshold, they may experience stress and as a result may be damaged.

Figure 2:
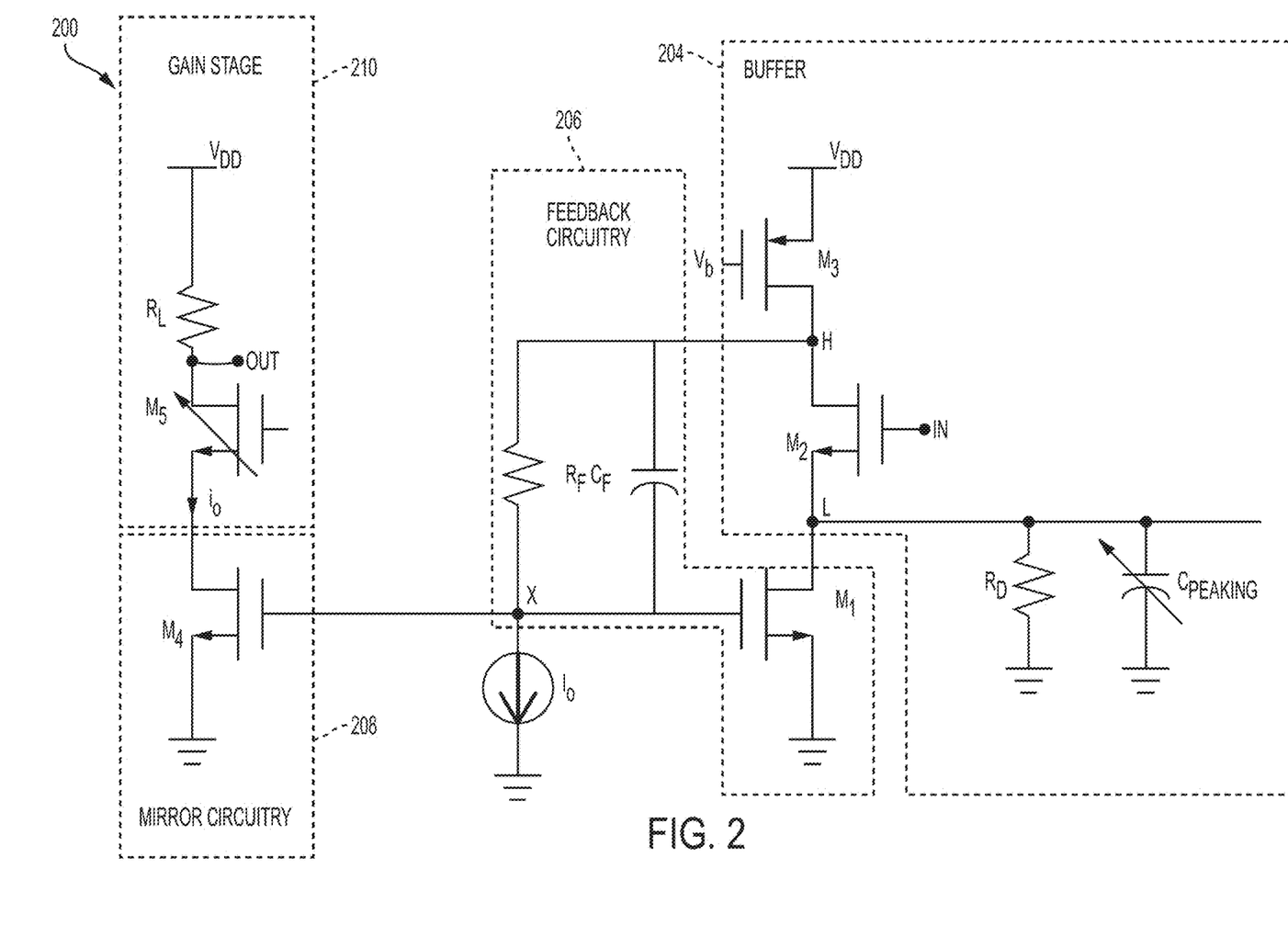
FIG. 2 is a circuit diagram illustrating a line receiver comprising a plurality of transistors, according to some non-limiting embodiments.

FIG. 2 is a circuit diagram illustrating a receiver comprising a plurality of transistors, according to some non-limiting embodiments. Receiver 200 may comprise buffer 204, which may serve as buffer 104 of FIG. 1. Buffer 204 may comprise a source follower in some embodiments. For example, buffer 204 may comprise transistor $M_2$, which may be arranged in a common-drain configuration. In some embodiments, transistor $M_2$ may be an NMOS transistor. In some embodiments, transistor $M_2$ may have a gate terminal coupled to node "in", a drain terminal coupled to node "H", and a source terminal coupled to node "L". Transistor $M_2$ may receive input signals provided by transmitter 101 via node "in". In response, transistor $M_2$ may provide a voltage at node "L". In some embodiments, transistor $M_2$ may exhibit a substantially unitary voltage gain. As a result, the voltage $V_L$ at node "L" may be substantially equal to the voltage $V_{in}$ at node "in". Transistor M2 may have a trans-conductance gain $g_{m2}$ that is between $1\ m\Omega^{-1}$ and $100\ m\Omega^{-1}$, when biased in the saturation region In some embodiments, buffer 204 may comprise an impedance element. The impedance element may be coupled to source terminal of transistor $M_2$. In some embodiments, the impedance element may comprise a resistive element. For example, the impedance element may comprise resistor $R_D$. In some embodiments, the impedance element may comprise a capacitive element. For example, the impedance element may comprise capacitor $C_{Peaking}$. In some embodiments, $C_{Peaking}$ may be a variable capacitor (e.g., a varactor). In some embodiments, by varying the capacitance associated with capacitor $C_{Peaking}$ and/or the resistance associated with resistor $R_D$, the frequency response of buffer 204, and as a result of receiver 200, may be varied. For example, by varying at least one, or both, of such parameters, the cut-off frequency (e.g., the 3 dB-frequency) of buffer 204 may be varied.

In some embodiments, buffer 200 may comprise transistor $M_3$. Transistor $M_3$ may be coupled to transistor $M_2$ in any suitable way. For example, transistor M3 may have a drain terminal coupled to the drain terminal of transistor $M_2$, a source terminal coupled to a supply voltage $V_{DD}$, and a gate terminal configured to receive a voltage $V_b$. Supply voltage $V_{DD}$ may be less than 1V in some embodiments. In some embodiments, voltage $V_b$ may be configured to place transistor $M_3$ in saturation. Transistor $M_3$ may be coupled to transistor $M_2$ in an arrangement that provides a high impedance at node "H" (e.g., more than $5K\Omega$, more than $50K\Omega$, or more than $100K\Omega$). In some embodiments, being node "H" connected to the drain of transistor $M_3$, its impedance may be proportional to the drain resistance of transistor $M_3$.

The inventors have appreciated that if the load of receiver 200 was to be coupled to the output terminal of buffer 204 (e.g., the terminal coupled to node "L"), the gain of the receiver would be proportional to the trans-conductance $g_{m2}$ of transistor $M_2$. Because $g_{m2}$ may fluctuate in response to process and temperature variations, the gain of receiver 200 may also exhibit fluctuations. This situation may be undesirable as it may produce noise on the output signal. In addition, the linearity of receiver 200 may be limited by the low supply voltage available. Accordingly, when a low supply voltage is provided, biasing transistors $M_2$ and $M_3$ in saturation may be challenging, To obviate these problems, feedback circuitry 206 may be used. Feedback circuitry 206 may serve as feedback circuitry 106 of FIG. 1. Feedback circuitry 206 may comprise one or more transistors in some embodiments. For example, feedback circuitry 206 may comprise transistor $M_1$, which may be an NMOS transistor. Transistor $M_1$ may be coupled to buffer 204 in any suitable way. For example, transistor $M_1$ may comprise a drain terminal coupled to the source terminal of transistor $M_2$, a source terminal coupled to a reference terminal (e.g., a ground terminal), and a gate terminal coupled to the drain terminal of transistor $M_2$.

In some embodiments, to guarantee that transistors $M_1$, $M_2$ and $M_3$ are biased in the saturation region at the same time, the gate terminal of transistor M1 may be coupled to the drain terminal of transistor M2 via a feedback impedance element. The feedback impedance element may configured to provide a desired voltage drop between its terminals, thus providing a desired bias voltage to transistors $M_1$, $M_2$ and $M_3$. In this way, the transistors may be biased in the saturation region simultaneously, thus improving the linearity of receiver 200. In some embodiments, the feedback impedance element may comprise a resistive element, such as resistor $R_F$. In some embodiments, the feedback impedance element may comprise a capacitive element, such as capacitor $C_F$. The capacitor $C_F$ may be variable in some embodiments. Having a variable capacitor may be desirable as it may be used to adjust the bandwidth of the receiver as appropriate. Current generator $I_0$ may be coupled to node "X". In this configuration, the overall trans-conductance gain of the buffer coupled to the feedback circuitry may be significantly increased. For example, in some embodiments, the overall trans-conductance gain may be given by:

$$g_m^{boosted} = g_{m2}(1+g_{m1}\ r_0)$$

where $g_{m2}$ is the trans-conductance of transistor $M_2$, $g_{m1}$ is the trans-conductance of transistor $M_1$, and $r_0$ is the impedance at node "H".

When an input voltage $V_{in}$ is received at node "in", the intermediate voltage $V_x$ at node "X" may be given by the following expression:

$$V_x = -V_{in}(g_{m2}\ r_0)/(1+R_D\ g_m^{boosted}) = -V_{in}(g_{m2}\ r_0)/(1+R_D\ g_{m2}(1+g_{m1}\ r_0))$$

If the product $(g_{m1}\ r_0) \gg 1$ (e.g., more than 10), then $V_x$ may be approximated by $$V_x = -V_{in}(g_{m2}\ r_0)/(1+R_D\ g_{m2}\ g_{m1}\ r_0)$$

If the product $(R_D\ g_{m2}\ g_{m1}\ r_0) \gg 1$ (e.g., more than 10), then $V_x$ may be approximated by $$V_x = -V_{in}/(R_D\ g_{m1})$$

Mirror circuitry 208 may serve as mirror circuitry 108 of FIG. 1. In some embodiments, mirror circuitry 208 may be configured to receive voltage $V_x$, and to provide a current that is substantially independent of $g_{m1}$. In some embodiments, mirror circuitry 208 may comprise transistor $M_4$, which may be coupled to feedback circuitry 206 in any suitable way. For example, transistor $M_4$ may comprise a source terminal coupled to the source terminal of transistor $M_1$, and a gate terminal coupled to the gate terminal of transistor $M_1$. In this way, transistors $M_1$ and $M_4$ may have the same gate-source voltage, and as a result the same trans-conductance gain. In response to receiving $V_x$, transistor $M_4$ may generate a current $i_0$ flowing between its source and drain terminals. The current $i_0$ may be given by $$i_0 = -g_{m4} V_x$$

where $g_{m4}$ is the trans-conductance gain of transistor $M_4$. In the embodiments in which $g_{m4} = g_{m1}$, the current may be given by $$i_0 = -g_{m4} V_x = -g_{m1} V_x = V_{in}/R_D$$

As shown, the current may be substantially equal (e.g., between 75% and 125%, between 90% and 110%, between 95% and 105%, or between 99% and 101%) to the current flowing in the resistor $R_D$.

Gain stage 210 may serve as gain stage 110 of FIG. 1. Gain stage 210 may comprise a load in some embodiments. The load may comprise a resistive element, such as resistor $R_L$. The load may be coupled to mirror circuitry 208 in any suitable way. For example, resistor $R_L$ may be coupled to the drain terminal of transistor $M_4$. The ac voltage $V_{out}$ at node "out" may be given by $i_0 R_L = (V_{in} R_L)/R_D$. As a result, the gain of receiver 200 may be equal to $A_v = V_{out}/V_{in} = R_L/R_D$. As shown, the gain may mainly depend on a resistance ratio, and therefore may be substantially insensitive to process and temperature variations. It should be appreciated that the gain and the frequency response of receiver 200 may be controlled independently of each other. The frequency response of the receiver may be adjusted by varying the value of the capacitance of capacitor $C_{Peaking}$ and/or the value of the resistance of resistor $R_D$. While variations in $R_D$ may also vary the gain of receiver, also variations in $R_L$ may vary the gain of receiver. Therefore, by setting desired values for $R_D$ and $R_L$, the gain and the frequency response may be independently set.

In some embodiments, gain stage 210 may comprise a transistor configured to operate as a switch. For example, transistor $M_5$ may be coupled between transistor $M_4$ and the load. Transistor $M_5$ may allow/inhibit current $i_0$ from reaching the load. For example, depending on the voltage of the signal at its gate terminal, transistor $M_5$ may be placed in an on-state (a conductive state) or an off-state (a high impedance state).

Figure 3:
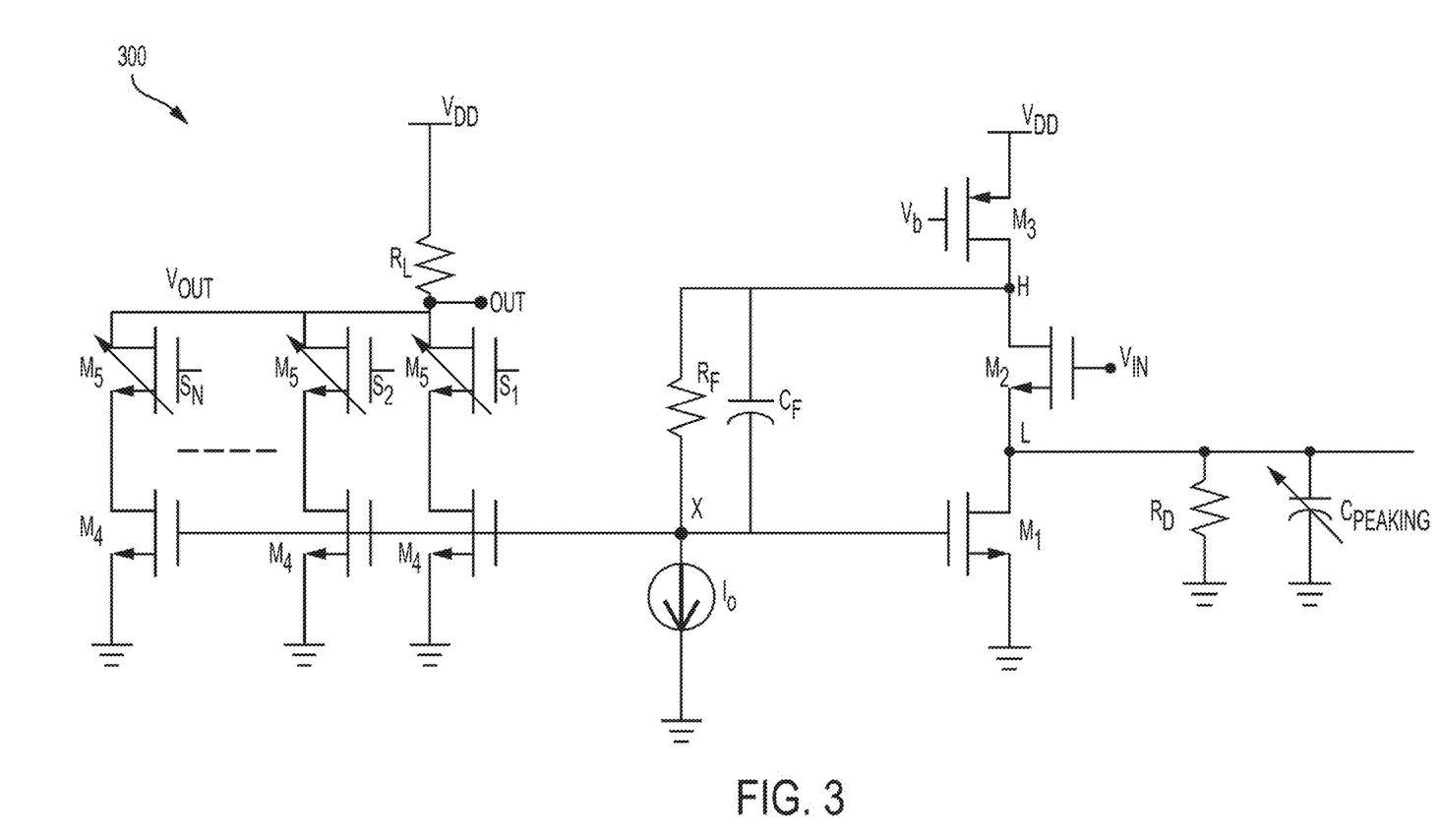
FIG. 3 is a circuit diagram illustrating a line receiver configured to provide an adjustable gain, according to some non-limiting embodiments.

In some embodiments, the gain of a receiver may be alternatively, or additionally, controlled by controlling the current flowing through the load. FIG. 3 is a circuit diagram illustrating a receiver configured to provide an adjustable gain, according to some non-limiting embodiments. Receiver 300 may comprise a plurality of transistors $M_4$ and a plurality of transistors $M_5$. Each of the plurality of transistors $M_4$ may have a source terminal coupled to the source terminal of transistor $M_1$, and a gate terminal coupled to the gate terminal of transistor $M_1$. In this way, each of the plurality of transistors $M_4$ may have substantially the same trans-conductance gain as transistor $M_1$. Each of the plurality of transistors $M_5$ may have a source terminal coupled to a drain terminal of a respective transistors $M_4$. In this way, each transistor $M_5$ may receive a current $i_0$.

The state of transistors $M_5$ may be controlled by using a plurality of control signals $S_1, S_2 \ldots S_n$. The control signals may be configured to place a respective transistor M5 in an on-state or an off-state. In this way, the amount of current flowing through the load may be controlled, and may depend on the number of transistors $M_5$ that are in an on-state. As a result, the gain of receiver 300 may be adjusted as desired.

Figure 4:
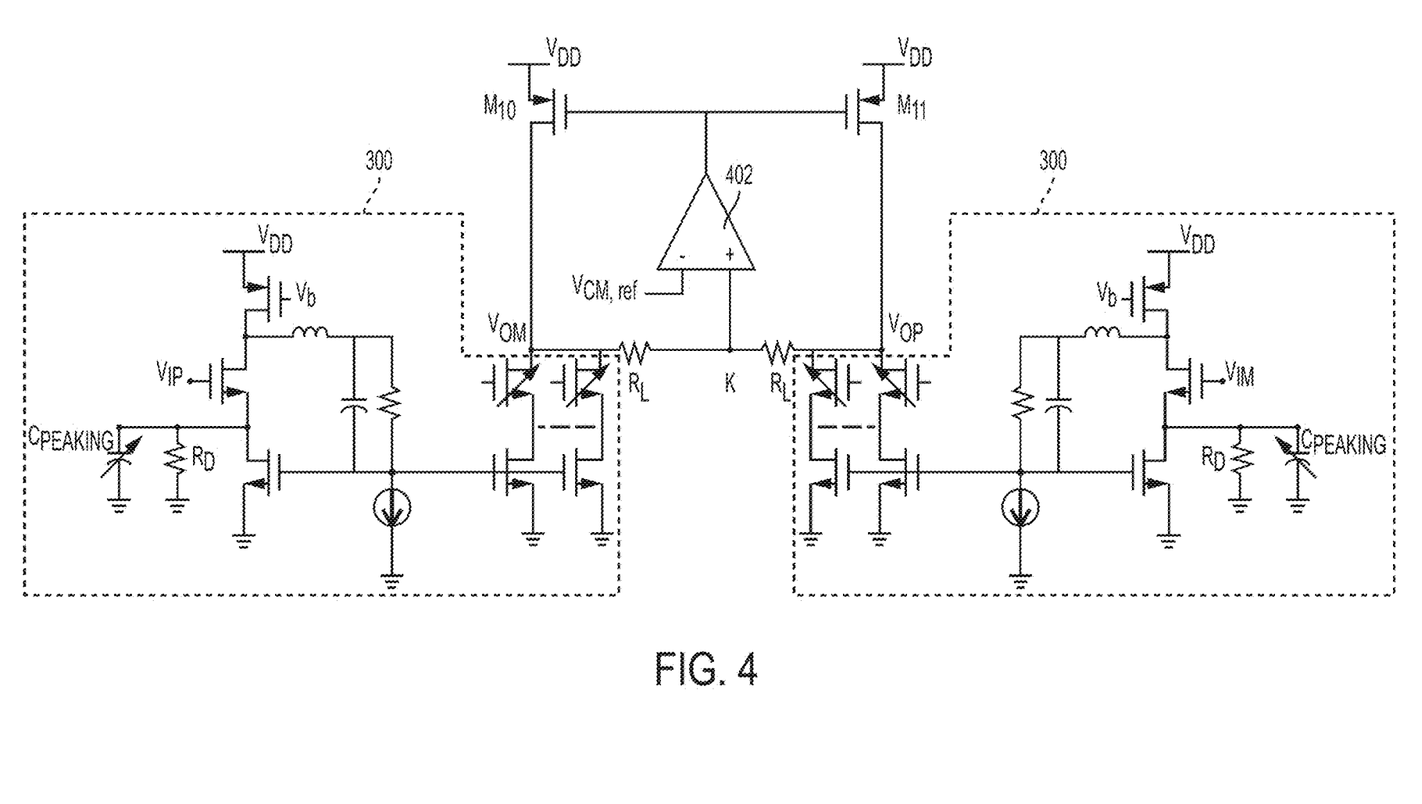
FIG. 4 is a circuit diagram illustrating a line receiver configured to operate differentially, according to some non-limiting embodiments.

FIGS. 2-3 illustrate receivers arranged to operate in a single ended configuration. However, it should be appreciated that receivers of the type described herein may alternatively be arranged to operate differentially. In some embodiments, a differential receiver may include more than one single ended receiver, such as receiver 200 or 300. FIG. 4 is a circuit diagram illustrating a receiver configured to operate differentially, according to some non-limiting embodiments. Receiver 400 may include a pair of receivers 300. Receiver 400 may be configured to receive a differential input signal, such as $V_{im}$-$V_{ip}$, and to produce a differential output signal, such as $V_{om}$-$V_{op}$. The amplitude of the output signal may depend on the gain provided by the receivers 300.

Receiver 400 may comprise circuit elements configured to control the common mode output signal. For example, receiver 400 may comprise resistors $R_L$, amplifier 402 and transistors $M_{10}$ and $M_{11}$. Such circuit elements may be configured to detect the common mode associated with the output signal, and to set the common mode to a desired level. For example, the common mode may be set to a predefined value, which may be independent from the selected gain. In the example illustrated in FIG. 4, the common mode may be sensed at node "K", and may be compared to a reference common mode voltage $V_{CM,ref}$ using amplifier 402. Being arranged in an open loop configuration, amplifier 402 may operate as a comparator. In some embodiments, if the voltage at node "K" is greater than $V_{CM,ref}$, amplifier 402 may output a voltage which may set transistors $M_{10}$ and $M_{11}$ in an off-state. In contrast, if the voltage at node "K" is less than $V_{CM,ref}$, amplifier 402 may output a voltage which may set transistors $M_{10}$ and $M_{11}$ in an on-state. The opposite logic may alternatively be used in other embodiments. Being coupled to the output terminals of receiver 400, transistors $M_{10}$ and $M_{11}$ may close the feedback loop thus setting the common mode of the output signal to $V_{CM,ref}$. Being $V_{CM,ref}$ independent from the gain, distortion to the output signal may be limited.

Figure 5:
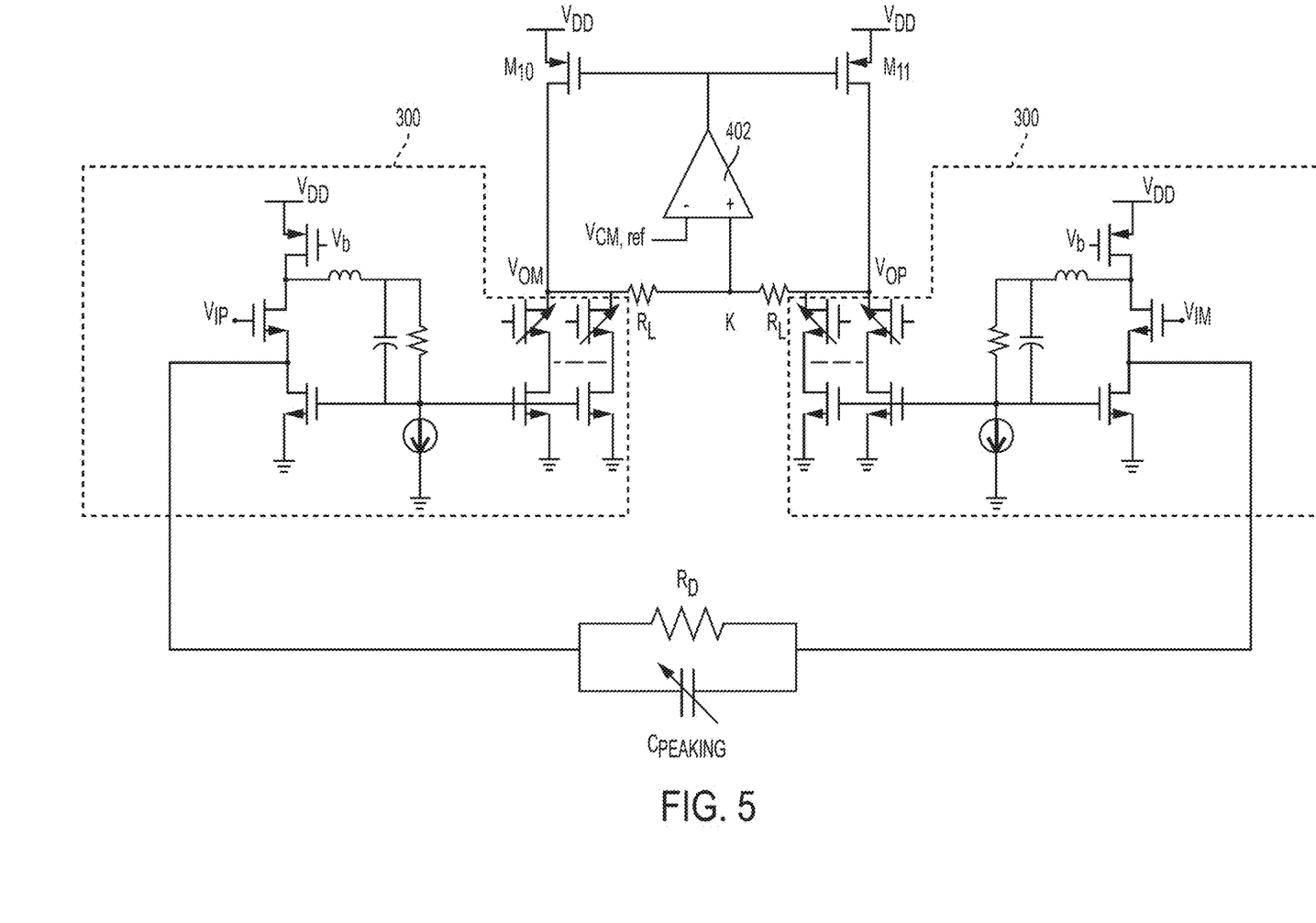
FIG. 5 is a circuit diagram illustrating another line receiver configured to operate differentially, according to some non-limiting embodiments.

While FIG. 4 illustrates resistors $R_D$ and capacitors $C_{peaking}$ as being connected between node "L" and the ground terminal, other configurations are also possible. For example, in some embodiments, resistor $R_D$ and capacitor $C_{peaking}$ may be connected between the differential nodes, as illustrated in FIG. 5.

Various aspects of the apparatus and techniques described herein may be used alone, in combination, or in a variety of arrangements not specifically discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including", "comprising", "having", "containing" or "involving" and variations thereof herein, is meant to encompass the items listed thereafter and equivalents thereof as well as additional items.

The use of "coupled" or "connected" is meant to refer to circuit elements, or signals, that are either directly linked to one another or through intermediate components.

What is claimed is:

1. A line receiver comprising:
   a buffer configured to receive an input signal, the buffer having a first transconductance gain and comprising a first transistor;
   feedback circuitry coupled to the buffer and configured to provide a second transconductance gain greater than the first transconductance gain, the feedback circuitry comprising a second transistor coupled to the first transistor and a first impedance element having first and second terminals, the first terminal being coupled to a drain terminal of the first transistor and the second terminal being coupled to a gate terminal of the second transistor;
   a third transistor having a terminal coupled to the first impedance element and to the first transistor;
   a resistor having a first terminal coupled to the first transistor and a second terminal directly coupled to a ground terminal, wherein the resistor is disposed in parallel to the second transistor;
   mirror circuitry coupled to the buffer and configured to generate a current in response to receiving an intermediate signal from the buffer;
   a gain stage configured to receive the current and to generate an output signal; and
   an amplifier having first and second input terminals and an output terminal, the first input terminal of the amplifier being coupled to the gain stage and the output terminal of the amplifier being coupled to the gain stage.

2. The line receiver of claim 1, wherein the output terminal of the amplifier is coupled to the gain stage through a fourth transistor.

3. The line receiver of claim 1, wherein the first input terminal of the amplifier is coupled to the gain stage through a second resistor.

4. The line receiver of claim 1, wherein the second input terminal of the amplifier is coupled to a reference common mode voltage supplier, and the amplifier is configured as a binary comparator.

5. The line receiver of claim 1, wherein the intermediate signal comprises a voltage of the gate terminal of the second transistor.

6. The line receiver of claim 1, wherein a source terminal of the first transistor is coupled to a drain terminal of the second transistor.

7. The line receiver of claim 1, further comprising a capacitor having a first terminal coupled to the first transistor and a second terminal directly coupled to the ground terminal.

8. The line receiver of claim 1, wherein the third transistor has a drain terminal coupled to the drain terminal of the first transistor.

9. The line receiver of claim 1, wherein the first impedance element comprises a capacitor and/or a second resistor.

10. The line receiver of claim 1, wherein the mirror circuitry comprises a fourth transistor arranged in a common source configuration.

11. The line receiver of claim 10, wherein the gain stage comprises a load coupled to a drain terminal of the fourth transistor.

12. The line receiver of claim 1, wherein the buffer is not configured to withstand supply voltages greater than 1V.

13. The line receiver of claim 1, wherein the third transistor is arranged in a common-source configuration.

14. A method for controlling a line receiver, comprising:
    receiving an input signal with a buffer having a transconductance gain and comprising a first transistor;
    amplifying the transconductance gain of the buffer with feedback circuitry coupled to the buffer, the feedback circuitry comprising a second transistor coupled to the first transistor;
    biasing the first and second transistors at least in part using a first impedance element comprising a first resistor and/or a first capacitor and having a first terminal coupled to a drain terminal of the first transistor and a second terminal coupled to a gate terminal of the second transistor, and at least in part using a third transistor having a terminal coupled to the first impedance element and to the first transistor;
    generating a current in response to receiving, with mirror circuitry, an intermediate signal from the buffer;
    generating, with a gain stage, an output signal in response to receiving the current;
    setting a bandwidth of the line receiver using a second resistor having a first terminal coupled to the first transistor and a second terminal directly coupled to a ground terminal, wherein the second resistor is disposed in parallel to the second transistor; and
    controlling a common mode of the output signal by comparing the output signal to a reference common mode signal.

15. The method of claim 14, wherein the current is a first current, and wherein generating the first current comprises mirroring a second current in the buffer.

16. The method of claim 14, wherein generating the output signal comprises providing an adjustable gain by selecting at least one among a plurality of drive transistors.

17. The method of claim 14, wherein setting the bandwidth of the line receiver is performed using also a second capacitor having a first terminal coupled to the first transistor and a second terminal directly coupled to the ground terminal.

18. The method of claim 14, wherein comparing the output signal to the reference common mode signal comprises providing the output signal and the reference common mode signal as inputs to an amplifier, and wherein controlling the common mode further comprises controlling the common mode based on an output of the amplifier.

19. The method of claim 14, wherein biasing the first and second transistors and at least in part using the third transistor having the terminal coupled to the first impedance element and to the first transistor comprises biasing the first and second transistors at least in part using the third transistor having a drain terminal coupled to the first impedance element and to the first transistor.

* * * * *